US010734895B2

(12) United States Patent
Hiramatsu et al.

(10) Patent No.: US 10,734,895 B2
(45) Date of Patent: Aug. 4, 2020

(54) POWER LOSS SUPPRESSED POWER SOURCE CIRCUIT AND THERMAL PRINTING DEVICE USING THE SAME

(71) Applicant: BROTHER KOGYO KABUSHIKI KAISHA, Nagoya-shi, Aichi (JP)

(72) Inventors: Yuki Hiramatsu, Nukata-gun (JP); Masakazu Nakano, Nagoya (JP); Ryohei Murabayashi, Mie-gun (JP)

(73) Assignee: Brother Kogyo Kabushiki Kaisha, Nagoya, Aichi (JP)

( * ) Notice: Subject to any disclaimer, the term of this patent is extended or adjusted under 35 U.S.C. 154(b) by 0 days.

(21) Appl. No.: 16/360,087

(22) Filed: Mar. 21, 2019

(65) Prior Publication Data
US 2019/0222120 A1    Jul. 18, 2019

Related U.S. Application Data

(63) Continuation of application No. PCT/JP2017/031154, filed on Aug. 30, 2017.

(30) Foreign Application Priority Data

Sep. 27, 2016 (JP) ................. 2016-187766

(51) Int. Cl.
*B41J 2/32* (2006.01)
*H02M 3/156* (2006.01)
(Continued)

(52) U.S. Cl.
CPC ............. *H02M 3/156* (2013.01); *B41J 2/32* (2013.01); *B41J 2/35* (2013.01); *B41J 3/36* (2013.01);
(Continued)

(58) Field of Classification Search
CPC ......... B41J 2/32; B41J 2/35; B41J 3/36; B41J 3/4075; B41J 29/393; G01R 19/16542; H02M 3/156
See application file for complete search history.

(56) References Cited

U.S. PATENT DOCUMENTS

2002/0105309 A1    8/2002  Rutter et al.
2002/0105311 A1    8/2002  Rutter et al.
(Continued)

FOREIGN PATENT DOCUMENTS

JP    H06-54457 A     2/1994
JP    2004-520794 A   7/2004
(Continued)

OTHER PUBLICATIONS

International Search Report dated Nov. 21, 2017 issued in PCT/JP2017/031154.
(Continued)

*Primary Examiner* — Lamson D Nguyen
(74) *Attorney, Agent, or Firm* — Scully, Scott, Murphy & Presser, PC (57) ABSTRACT

A power source circuit includes a first converter, a second converter, a switch and a controller. The switch is configured to switch between a first state and a second state, in which in the first state, a first voltage is not supplied to the second converter whereas in the second state, the first voltage is supplied to the second converter. The controller controls the switch to change the first state to the second state in response to detection of the change in a first current flowing in a first load. The second converter is configured to convert a battery voltage of a battery to a second voltage lower than the battery voltage when the switch switches to the first state and convert the first voltage to the second voltage lower than the first voltage when the switch switches to the second state.

12 Claims, 7 Drawing Sheets

(51) Int. Cl.
  *B41J 2/35* (2006.01)
  *B41J 3/407* (2006.01)
  *G01R 19/165* (2006.01)
  *H02M 3/00* (2006.01)
  *B41J 29/393* (2006.01)
  *B41J 3/36* (2006.01)
  *H02M 1/00* (2006.01)

(52) U.S. Cl.
  CPC ........... *B41J 3/4075* (2013.01); *B41J 29/393* (2013.01); *G01R 19/16542* (2013.01); *H02M 3/00* (2013.01); *H02M 2001/0009* (2013.01)

(56) References Cited

U.S. PATENT DOCUMENTS

| | | |
|---|---|---|
| 2002/0175661 A1 | 11/2002 | Wheeler et al. |
| 2016/0020696 A1 | 1/2016 | Shibata et al. |
| 2018/0302006 A1* | 10/2018 | Smidt .................... H02M 1/126 |
| 2019/0115838 A1* | 4/2019 | Radic ...................... H02M 1/08 |
| 2020/0033198 A1* | 1/2020 | Kim ......................... G01K 7/16 |

FOREIGN PATENT DOCUMENTS

| | | |
|---|---|---|
| JP | 2009-273249 A | 11/2009 |
| JP | 2016-025748 A | 2/2016 |

OTHER PUBLICATIONS

Translation of International Preliminary Report on Patentability dated Apr. 11, 2019 issued in PCT/JP2017/031154.

* cited by examiner

POWER LOSS SUPPRESSED POWER SOURCE CIRCUIT AND THERMAL PRINTING DEVICE USING THE SAME

CROSS REFERENCE TO RELATED APPLICATION

This application claims priority from Japanese Patent Application No. 2016-187766 filed Sep. 27, 2016. The entire content of the priority application is incorporated herein by reference.

TECHNICAL FIELD

The present invention relates to a power source circuit and a thermal print apparatus using the same.

BACKGROUND

A power source circuit for producing a plurality of different level voltages from an output voltage of a battery (hereinafter referred to as "battery voltage") has been proposed for use in a battery-driven electrical equipment. Japanese Patent Application Publication No. HEI-6-54457 discloses a power source circuit including a DC-to-DC converter, a series-connection voltage adjusting unit, a voltage detector, and a change-over device. The DC-to-DC converter operates to boost the battery voltage to a first voltage (for example, 12V). The series-connection voltage adjusting unit operates to selectively lower the battery voltage or the first voltage whichever is applied thereto to a second voltage (for example, 5V). The voltage detector operates to detect the battery voltage. The change-over device changes over the voltage applied to the series-connection voltage adjusting unit to either the battery voltage or the first voltage. The voltage detector operates the change-over device to change the voltage applied to the series-connection adjusting unit to be the battery voltage when the battery voltage is larger than a predetermined level, whereas the voltage detector operates the change-over device to change the voltage applied to the series-connection adjusting unit to be the first voltage when the battery voltage is equal to or smaller than the predetermined level.

SUMMARY

In the above-described power source circuit, in order to stably produce the second voltage even when an instantaneous voltage drop of the battery occurs, the predetermined level of the voltage detector needs to set higher (for example, 6V) than the voltage at least necessitated for the series-connection voltage adjusting unit to produce the second voltage. For this reason, even when the battery voltage suffices for the series-connection voltage adjusting unit to produce the second voltage, the voltage detector may operate the change-over device to change the voltage so that the first voltage is applied to the series-connection adjusting unit. In this case, the first voltage booted by the DC-to-DC converter is lowered to the second voltage by the series-connection adjusting unit. As such, it is problematic in yielding power loss.

In view of the foregoing, it is an object of the present disclosure to suppress the power loss and to provide a power source circuit and a thermal printing device provided with such a power source circuit.

In order to attain the above and other objects, the disclosure provides a power source circuit including a first converter, a second converter, a switch and a controller. The first converter is configured to convert a battery voltage of a battery to a first voltage higher in level than the battery voltage. The first voltage is supplied to a first load. The second converter is configured to convert selective one of the battery voltage and the first voltage to a second voltage lower in level than the voltage to be converted. The second voltage is supplied to a second load. The switch is configured to switch between a first state and a second state, in which in the first state, the first voltage is not supplied to the second converter whereas in the second state, the first voltage is supplied to the second converter. The controller is configured to detect change in a first current flowing in the first load. The first current is liable to change caused by an instantaneous change of the first load. The controller controls the switch to change the first state to the second state in response to detection of the change in the first current. The second converter is configured to convert the battery voltage to the second voltage lower than the battery voltage when the switch switches to the first state and convert the first voltage to the second voltage lower than the first voltage when the switch switches to the second state.

According to another aspect, the disclosure provides a thermal printing device including the power source circuit according to above aspect and a thermal head. The thermal head is driven by the first voltage supplied from the power source circuit.

BRIEF DESCRIPTION OF THE DRAWINGS

The particular features and advantages of the disclosure will become apparent from the following description taken in connection with the accompanying drawings, in which.

DETAILED DESCRIPTION

Hereinafter, a printing device 1 according to one embodiment will be described with reference to FIGS. 1 through 7.

<1. Configuration of Printing Device>

Figure 1:
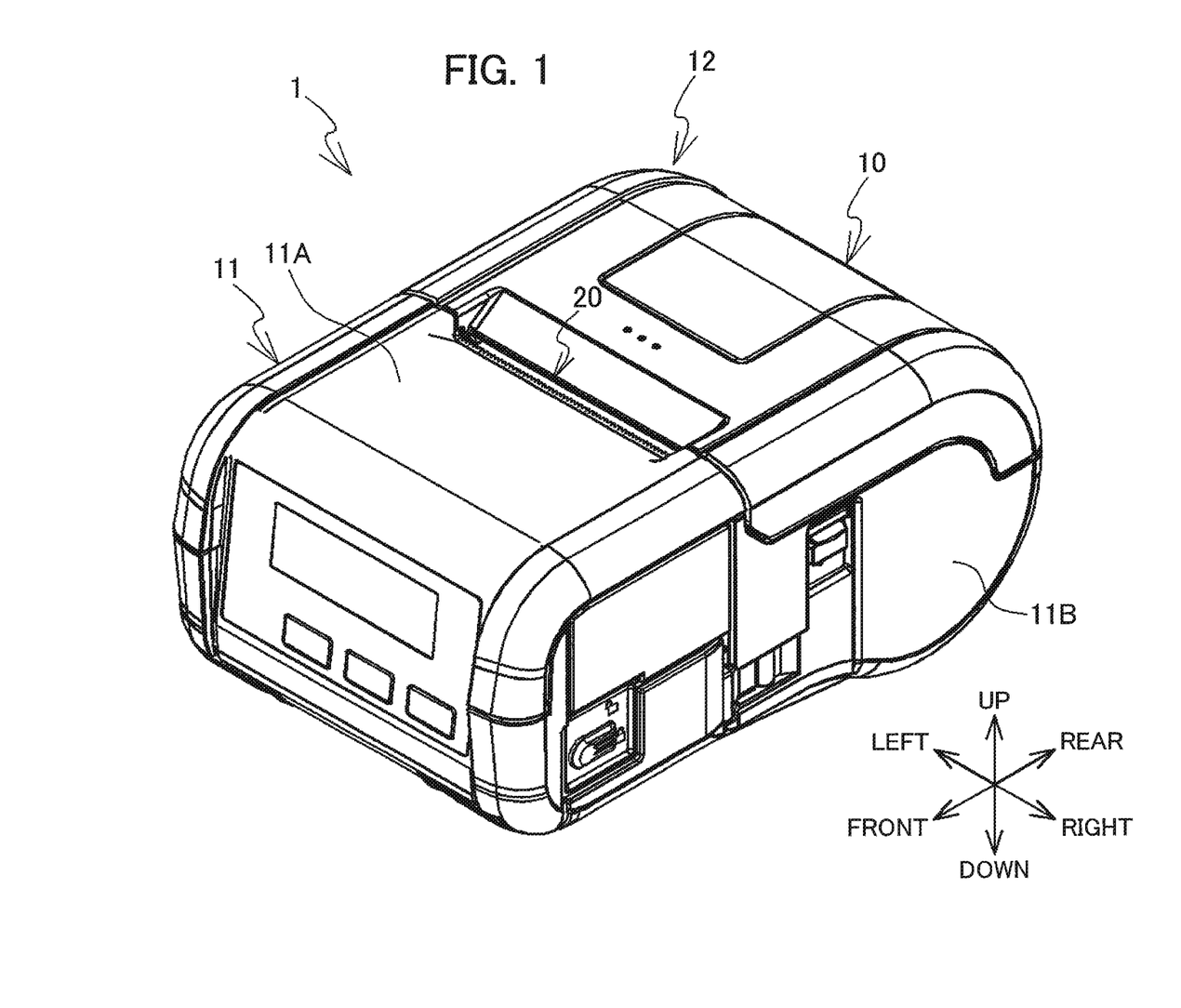
FIG. 1 is a perspective view showing a printing device 1 (with a second cover closed)
Figure 2:
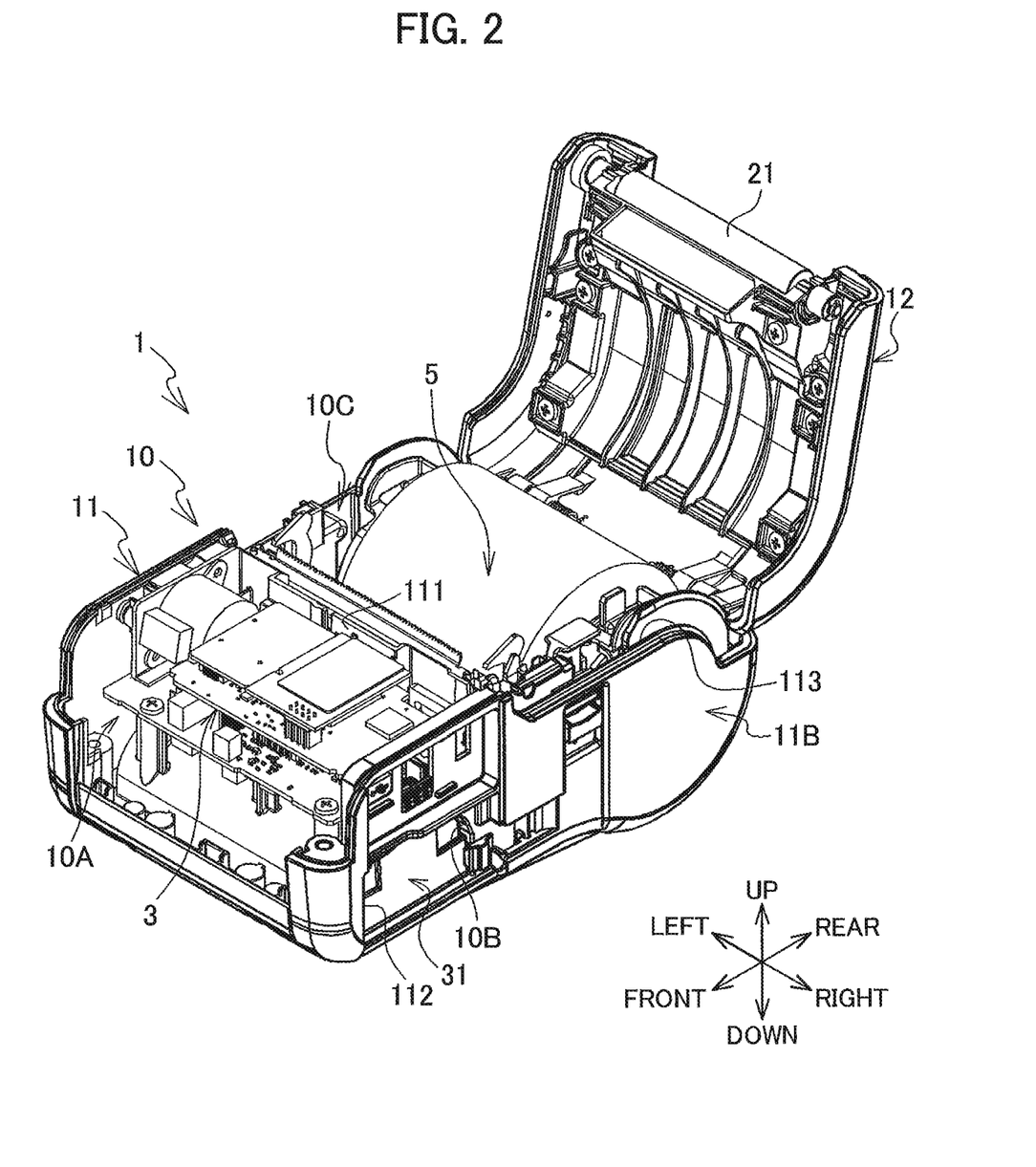
FIG. 2 is a perspective view showing the printing device 1 (with the second cover open)

As illustrated in FIG. 1, the printing device 1 is of a thermal printing type in which printing is performed on thermal paper. As illustrated in FIG. 2, the printing device 1 is driven by supplying a battery voltage Vb from a battery 31. The printing device 1 has a clip (not shown) capable of hooking onto a user's belt. The user can carry the printing device 1 by hooking the clip onto the user's belt.

Throughout the specification, the right lower side, the left upper side, the right lower side, the left lower side, the upper side, and the lower side in FIG. 1 will be referred to as right side, left side, rear side, front side, upper side, and lower side, respectively, when describing the printing device 1.

As illustrated in FIGS. 1 and 2, the printing device 1 includes a casing 10 extending in the front-rear direction. The casing 10 is of a substantially rectangular parallelepiped shape. The casing 10 includes a first cover 11 and a second cover 12. The first cover 11 has approximately a half length in the front-rear direction and the second cover 12 also has approximately a half length in the front-rear direction. The second cover 12 is in a position further in the front-to-rear direction than the first cover 11. The first cover 11 is defined by a half of the front part upper-wall of the casing 10, front wall of the casing 10, a half of the front part left-side wall of the casing 10, and a half of the front part right-side wall of the casing 10. Also, the second cover 11 is defined by a second half of the rear part upper wall, rear wall, a second half of the rear part left-side wall, and a second half of the rear part right-side wall. The second cover 12 is pivotally movable to extend in the rear upper direction. A platen 21 extends in the right-left direction and is rotatably supported on the second cover 12 at the free end thereof.

As illustrated in FIG. 2, a first accommodating portion 10A is formed below the upper wall 11A of the first cover 11 (see FIG. 1). The first accommodating portion 10A is a part of the space surrounded by the casing 10. The first accommodating portion 10A accommodates a control boards 3 including a plurality of substrates and a thermal head 411 (see FIG. 3). The control boards 3 is held at the center of the first accommodating portion 10A. A power source circuit 30 (see FIG. 3), a CPU 421 (see FIG. 3), and a communication module or the like are mounted on the control boards 3. The thermal head 411 is held by the casing 10 at the rear end portion of the first accommodating portion 10A. Specifically, the thermal head 411 is held on the rear surface of a support portion 111 which is provided at a center of the space surrounded by the casing 10. The support portion 111 partitions the first accommodating portion 10A and a third accommodating portion 10C (described later).

As illustrated in FIG. 2, the right-side wall 11B of the first cover 11 is formed with an opening 112 at a front portion of the right-side wall 11B. The opening 112 penetrates the first cover 11 in the left-right direction. A second accommodating portion 10B is formed on the left side of the opening 112. The second accommodating portion 10B is a part of the space surrounded by the casing 10. The second accommodating portion 10B can accommodate the battery 31. Specifically, the second accommodating portion 10B accommodates the battery 31 so that the battery 31 is electrically connected with the printing device 1. The battery 31 is a rechargeable, secondary battery. In the present embodiment, the fully charged battery voltage Vb is 4.0V, for example. The battery voltage Vb is lowered as the battery 31 discharges. The battery voltage Vb is allowed to be lowered to 2.7V, for example, otherwise the battery 31 is over-discharged. The battery 31 has an internal resistance (see FIG. 3), so that the battery voltage Vb decreases according to increase of a current flowing out from the battery 31 to the printing device 1.

As illustrated in FIG. 2, the third accommodating portion 10C is formed behind the first accommodating portion 10A in the rear direction. Specifically, the third accommodating potion 10C is formed behind the support portion 111 provided in the first accommodating portion 10A. The third accommodating portion 10C is a part of the space surrounded by the casing 10. The third accommodating portion 10C accommodates a roll onto which the printing medium, i.e., thermal paper, is wound. The third accommodating portion 10C communicates with the outside of the casing 10 through an opening 113 formed in the first cover 11. The opening 113 is formed in the rear part of the first cover 11 and opens upward. The opening 113 can be opened and closed according to pivotal movements of the second cover 12 about an axis extending in the left-right direction.

As illustrated in FIG. 1, in a closed state in which the second cover 12 closes the opening 113, a discharge opening 20 is formed between a rear-end portion of the upper wall 11A of the first cover 11 and a front-end portion of the second cover 12. In the closed state of the second cover 12, the thermal head 411 (see FIG. 3) and the platen 21 (see FIG. 2) are facing each other below the discharge opening 20 in the front-rear direction. When the printing medium (thermal paper) fed out from the roll 5 is conveyed between the thermal head 411 and the platen 21, the platen 21 presses the printing medium against the thermal head 411 in the front direction. The platen 21 rotates while pressing the printing medium against the thermal head to convey the print medium to the discharge opening 20. After printing by the thermal head 411 was performed on the printing medium, the printing medium is discharged to the outside of the casing 10 through the discharge opening 20.

<Power Source Circuit 30>

Figure 3:
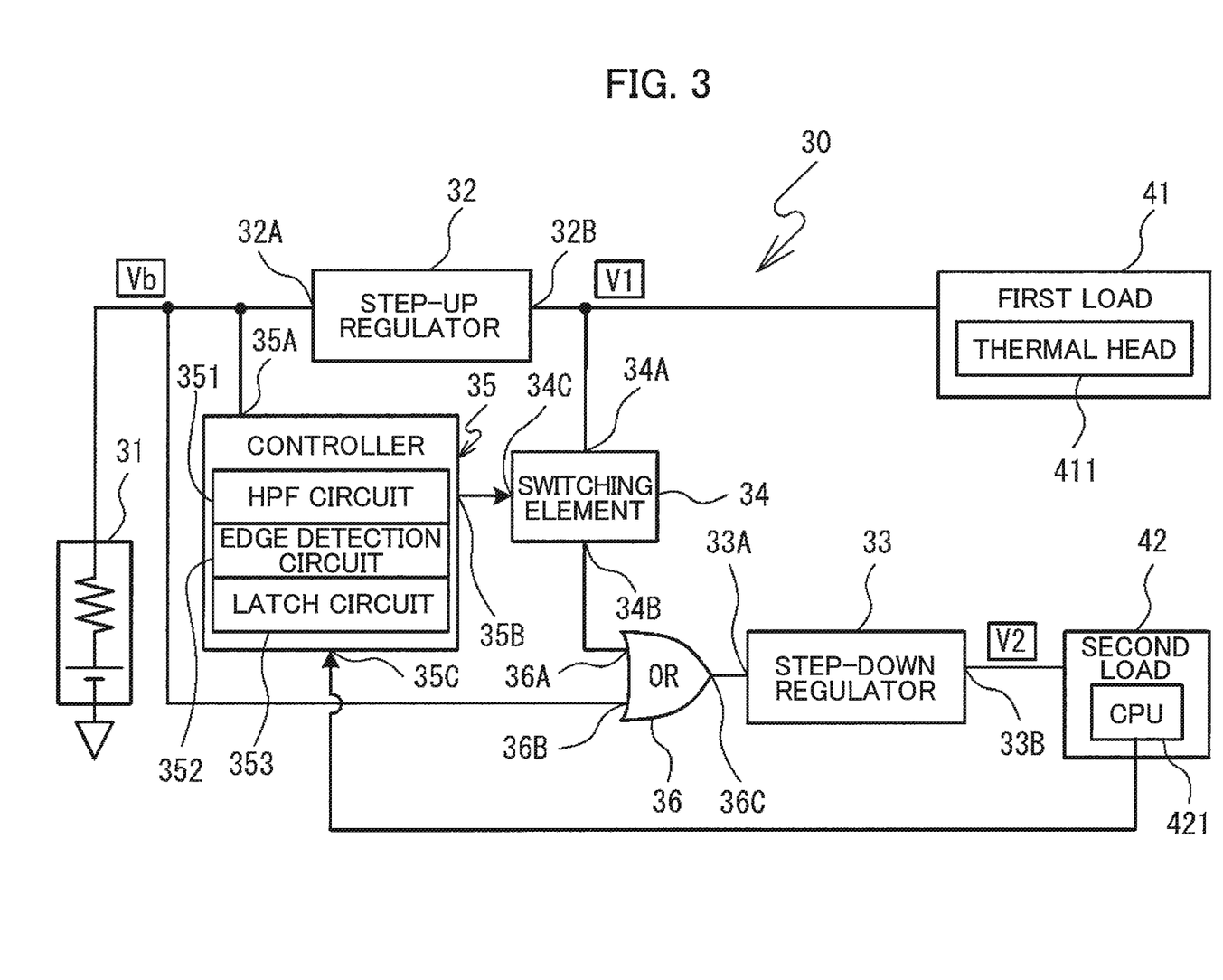
FIG. 3 is a block diagram showing a power source circuit 30.

As illustrated in FIG. 3, power source circuit 30 includes a step-up regulator 32, a step-down regulator 33, a switching element 34, a controller 35, and OR circuit 36.

The step-up regulator 32 boosts the battery voltage Vb to a first voltage V1. The first voltage V1 is 7.5V, for example. The first voltage V1 is greater than the battery voltage Vb. The step-up regulator 32 supplies the first voltage V1 to a first load 41 to drive the same. The first load 41 includes a device that can be driven with the first voltage V1. In the present embodiment, the first load 41 includes at least a thermal head 411. The thermal head 411 is driven by the first voltage V1 supplied from the step-up regulator 32. An input terminal 32A of the step-up regulator 32 is electrically connected to a terminal of the battery, and an output terminal 32B of the step-up regulator 32 is electrically connected to a terminal of the first load 41.

The step-up regulator 33 steps down either the battery voltage Vb or the first voltage V1 to a second voltage V2. The second voltage V2 is 3.3V, for example. While the second voltage V2 is lower than the fully charted battery voltage Vb of, for example, 4.0V, the second voltage V2 may become greater than the discharged battery voltage Vb discharged to, for example, 2.7V. That is, the second voltage V2 is normally lower than 4.0V, however, the second voltage V2 may become greater than 2.7V. The step-down regulator 33 supplies the second voltage V2 to a second load 42 to drive the same. The second load 42 includes a device that can be driven with the second voltage V2. In the present embodiment, the second load 42 includes at least a CPU 421. An input terminal 33A of the step-down regulator 33 is electrically connected to an output terminal 36C of the OR circuit 36. An output terminal 33B of the step-down regulator 33 is electrically connected to a terminal of the second load 42.

When a voltage applied to the step-down regulator 33 via the input terminal 33A is lower than the second voltage V2, the step-down regulator 33 cannot generate the second voltage V2. That is, the voltage applied to the step-down regulator 33 via the input terminal 33A need to be greater than or equal to the second voltage V2 so that the second voltage V2 is stably supplied to the second load 42 by the step-down regulator 33.

The switching element 34 has a terminal 34A, a terminal 34B, and a control terminal 34C. The switching element 34 is configured to be switchable between a first state in which the terminals 34A and 34B do not conduct with each other and a second state in which the terminals 34A and 34B conduct with each other. The switching element 34 switches the first state to the second state and vice versa according to a signal inputted to the control terminal 34C. Specifically, when a disable signal (for example, low signal) inputted to the switching element 34 via the control terminal 34C, the switching element 34 becomes the first state in which the terminals 34A and 34B do not conduct with each other. On the other hand, when an enable signal (for example, high signal) inputted to the switching element 34 via the control terminal 34C, the switching element 34 becomes the second state in which the terminals 34A and 34B conduct with each other.

The terminal 34A of the switching element 34 is electrically connected to the output terminal 32B of the step-up regulator 32. The terminal 34B of the switching element is electrically connected to an input terminal 36A of the OR circuit 36. The control terminal 34C is electrically connected to an output terminal 35B of the controller 35. When the switching element 34 is the first state, the first voltage V1 is not applied to the step-down regulator 33 via the OR circuit 36. On the other hand, when the switching element 34 is the second state, the first voltage V1 is applied to the step-down regulator 33 via the OR circuit 36.

The OR circuit 36 outputs a voltage input to the OR circuit 36 via the input terminal 36A or a voltage input to the OR circuit 36 via an input terminal 36B from the output terminal 36C. The input terminal 36 A of the OR circuit 36 is electrically connected to the terminal 34B of the switching element 34. The input terminal 36B of the OR circuit 36 is electrically connected to the terminal of the battery 31. When the switching element 34 is first state in which the terminal 34A and 34B do not conduct with each other, a voltage input to the OR circuit 36 via the input terminal 36A becomes 0V, while a voltage input to the OR circuit 36 via the input terminal 36B becomes battery voltage Vb of the battery 31. In this case, OR circuit 36 outputs the battery voltage Vb of the input terminal 36B from the output terminal 36C. On the other hand, when the switching element 34 is second state in which the terminal 34A and 34B conduct with each other, a voltage input to the OR circuit 36 via the input terminal 36A becomes the first voltage V1, while a voltage input to the OR circuit 36 via the input terminal 36B becomes battery voltage Vb of the battery 31. In this case, OR circuit 36 outputs the first voltage V1 boosted greater than the battery voltage Vb. That is, the OR circuit 36 outputs the larger one of the voltages input from the input terminal 36A and the input terminal 36B from the output terminal 36C.

The controller 35 includes an input terminal 35A, an output terminal 35B, and a control terminal 35C. The controller 35 outputs the disable signal and the enable signal from the output terminal 35B according to a voltage input from the input terminal 35A. The input terminal 35A of the controller 35 is electrically connected to the terminal of the battery 31. The output terminal 35B of the controller 35 is electrically connected to the control terminal 34C of the switching element 34 so that the disable signal and the enable signal can be input to the switching element 34 via the control terminal 34C. The control terminal 35C of the controller 35 is electrically connected to a terminal of the CPU 421 included in the second load 42.

The controller 35 includes at least a high-pass filter (HPF) circuit 351, an edge detection circuit 352, and a latch circuit 353. The HPF circuit 351 allows frequency components greater than a predetermined cutoff frequency to pass through, while the HPF does not allow frequency components lower than the predetermined cutoff frequency to pass through. Here, the frequency components indicate time-dependent changes in battery voltage Vb input via the input terminal 35A. The HPF circuit 351 is a known analog filter circuit which is configured to a resistor and a capacitor. The HPF circuit 351 couples the input terminal 35B and the edge detection circuit 352 as an AC coupling. The edge detection circuit 352 detects an edge of an output voltage from the HPF circuit 351. The edge detection circuit 352 is a known edge detection circuit which is configured by a relay, a resistor, a capacitor, and a diode or the like.

When a voltage of the edge detected by the edge detection circuit 352 is greater than or equal to a threshold value, the controller 35 outputs the enable signal from the output terminal 35B. On the other hand, when the voltage of the edge detected by the edge detection circuit 352 is smaller than the threshold value, the controller 35 outputs the disable signal from the output terminal 35B. The edge voltage is indicated as an absolute value of the variation of the battery voltage Vb by the AC coupling. When the enable signal is output from the output terminal 35B, the latch circuit 353 latches the output state of the controller 35. Specifically, the latch circuit 353 latches the output state in which the enable signal is output from the output terminal 35B. The latch circuit 353 releases the latch according to the release signal from the CPU 421 which is input to the control terminal 35C.

As described above, when the disable signal is inputted to the switching element 34 from the output terminal 35 of the controller 35, the switching element 34 becomes the first state. On the other hand, when the enable signal is inputted to the switching element 34 from the output terminal 35 of the controller 35, the switching element 34 becomes the second state. Therefore, when the voltage of the edge detected by an edge detection circuit 352 is smaller than the threshold value, the switching element 34 becomes the first state because the disable signal is outputted from the output terminal 35B of the controller 35. On the other hand, when the voltage of the edge detected by the edge detection circuit 352 is greater than or equal to the threshold value, the switching element 34 switches to the second state from the first state because the enable signal is outputted from the output terminal 35B of the controller 35. In this case, the switching element 34 maintains the second state because the latch circuit 353 latches the output state in which the enable signal is outputted from the output terminal 35B of the controller 35. When the releasing signal is outputted from the CPU 421 to the control terminal 35C of the controller 35, the output state of the controller 35 latched by the latch circuit 353 is released. In response to the release of the latch, the signal outputted from the output terminal 35C is switched from the enable signal to the disable signal, so that the switching element 34 is switched from the second state to the first state.

<Operation of Power Source Circuit 30>

When the battery 31 is attached to the printing device 1, the step-up regulator 32 generates the first voltage V1 by boosting the battery voltage Vb. The first voltage V1 generated by the step-up regulator 32 is supplied to the first load 41 so that the device such as the thermal head 411 included in the first load 41 can be driven. At this time, the controller 35 outputs the disable signal from the output terminal 35B. The switching element 34 is brought to a first state in response to the disable signal being inputted to the switching element 34 via the control terminal 34C. In this case, since the terminals 34A and 34B of the switching element 34 are not conducted, a voltage inputted to the input terminal 36A of the OR circuit 36 is 0V. On the other hand, a voltage inputted to another input terminal 36B of the OR circuit 36 is the battery voltage Vb under the condition that the battery is set to the printing device 1. In this case, the OR circuit 36 outputs the battery voltage Vb input via the input terminal 36B from the output terminal 36C. The battery voltage Vb outputted from the output terminal 36C is inputted to the step-down regulator 33 via the input terminal 33A. The step-down regulator 33 generates the second voltage V2 by lowering the battery voltage Vb. The second voltage V2 generated by the step-down regulator 33 is supplied to the second load 42 so that the device such as the CPU 421 included in the second load 42 can be operated.

The operation of the power source circuit 30 when the printing process is started will be described with reference to a flowchart in FIG. 4. During a printing process, a load increases at a time when the thermal head 411 heats up. Therefore, a load current flowing in the first load 41 instantaneously abruptly increases. In this way, when the load current for the first load 41 instantaneously increases due to the heating of the thermal head 411, the battery voltage Vb instantaneously drops down.

When the battery voltage Vb instantaneously drops down, the controller 35 of the power source circuit 30 is applied with a steep falling signal which indicates the instantaneous drop of the battery voltage Vb via the input terminal 35A. A frequency component of the steep falling signal indicating the instantaneous drop of the battery voltage Vb is greater than the cutoff frequency of a high-pass filter (HPF) circuit 351. Therefore, the HPF circuit 351 passes the steep falling signal which indicates the instantaneously drop of the battery voltage Vb. An edge detection circuit 352 detects an edge of the voltage of the steep falling signal indicating the instantaneous drop of the battery voltage Vb based on an output voltage from the HPF circuit 351.

In S13 the controller 35 determines whether the edge voltage detected by the edge detection circuit 352 is greater than or equal to the threshold value. When the edge voltage is smaller than the threshold value, there is high possibility that the battery voltage Vb of the battery 31 is always greater than the second voltage during the printing process. In this case, the step-down regulator 33 can stably generate the second voltage by lowering the battery voltage Vb. Therefore, in S19, when the edge voltage is smaller than the threshold value (S13: NO), the controller 35 outputs the disable signal so that the step-down regulator 33 generates the second voltage from the battery voltage Vb.

In S19 the switching element 34 becomes the first state according to the input of the disable signal via the control terminal 34C. That is, the terminal 34A and 34B are not conducted with each other. In this case, as illustrated in FIG. 5, OR circuit 36 outputs the battery voltage Vb, from the output terminal 36C, which is input to the OR circuit 36 via the input terminal 36B. The step-down regulator 33 generates the second voltage V2 by lowering the battery voltage Vb input to the step-down regulator 33 via the input terminal 33A. The controller 35 continuously monitors the edge voltage detected by the edge detection circuit 352. According to such a configuration, while the edge voltage is lower than the threshold value, the state that the step-down regulator 33 steps down the battery voltage Vb to generate the second voltage V2 is maintained.

On the other hand, when the edge voltage is greater than or equal to the threshold value, there is high possibility that the battery voltage Vb of the battery 31 is smaller than the second voltage during the printing process. In this case, the step-down regulator 33 cannot stably generate the second voltage by lowering the battery voltage Vb. Therefore, in S15, when the edge voltage is smaller than the threshold value (S13: YES), the controller 35 outputs the enable signal so that the step-down regulator 33 generates the second voltage from the first voltage V1.

Figure 6:
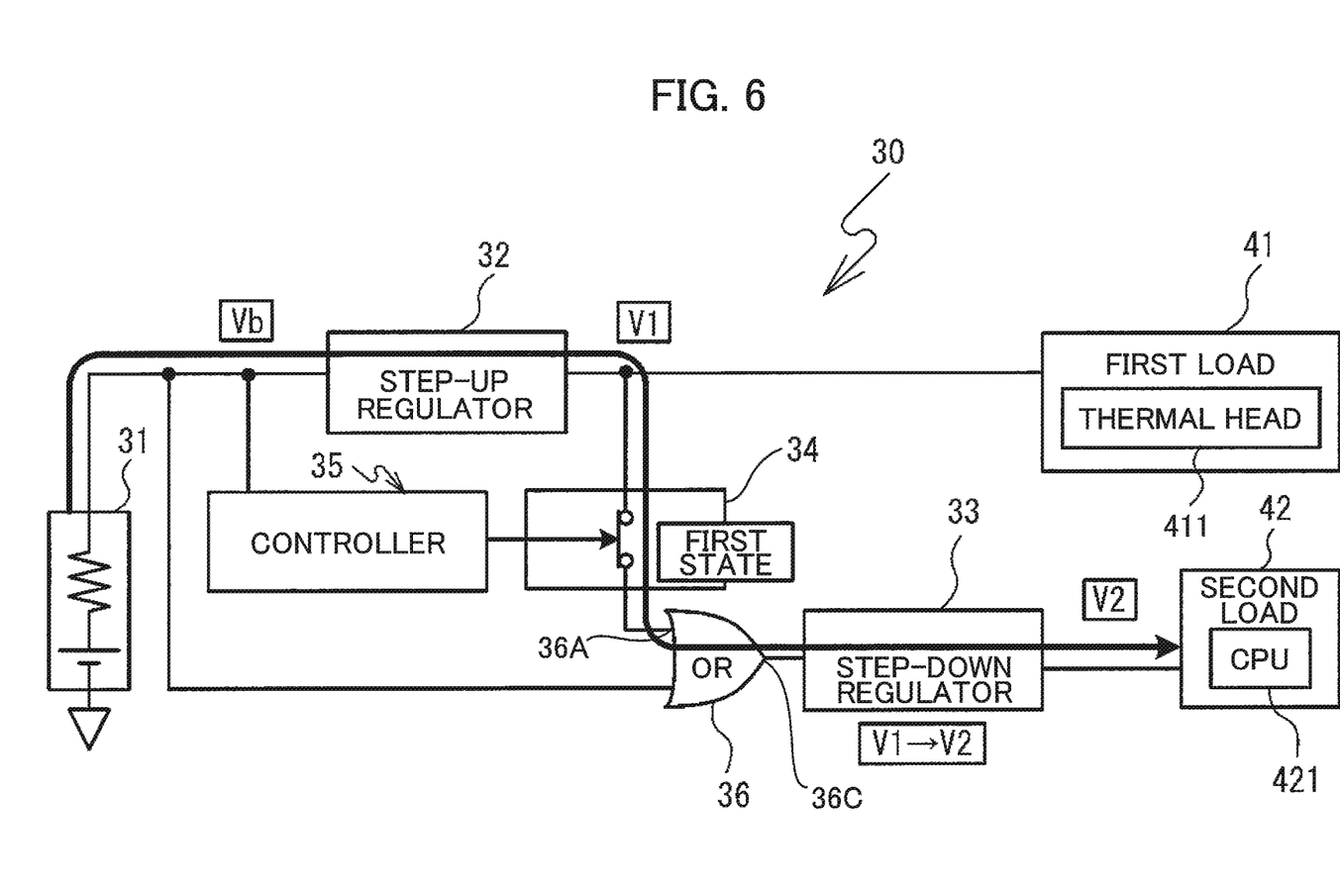
FIG. 6 a diagram illustrating application of the second voltage V2 to the second load 42 when the switching element 34 is in a second state.

In S15, the switching element 34 is brought to the second state because the enable signal is inputted to the control terminal 34C, so that the terminals 34A and 34B of the switching element 34 conduct with each other. As illustrated in FIG. 6, the first voltage is inputted to the OR circuit 36 via the input terminal 36A. The OR circuit 36 outputs the first voltage from the output terminal 36C, which is inputted to the OR circuit 36 via the input terminal 36A. In this case, the state of the switching element 34 is switched from a state in which the second voltage is generated from the battery voltage Vb to a state in which the second voltage is generated from the first voltage.

Figure 4:
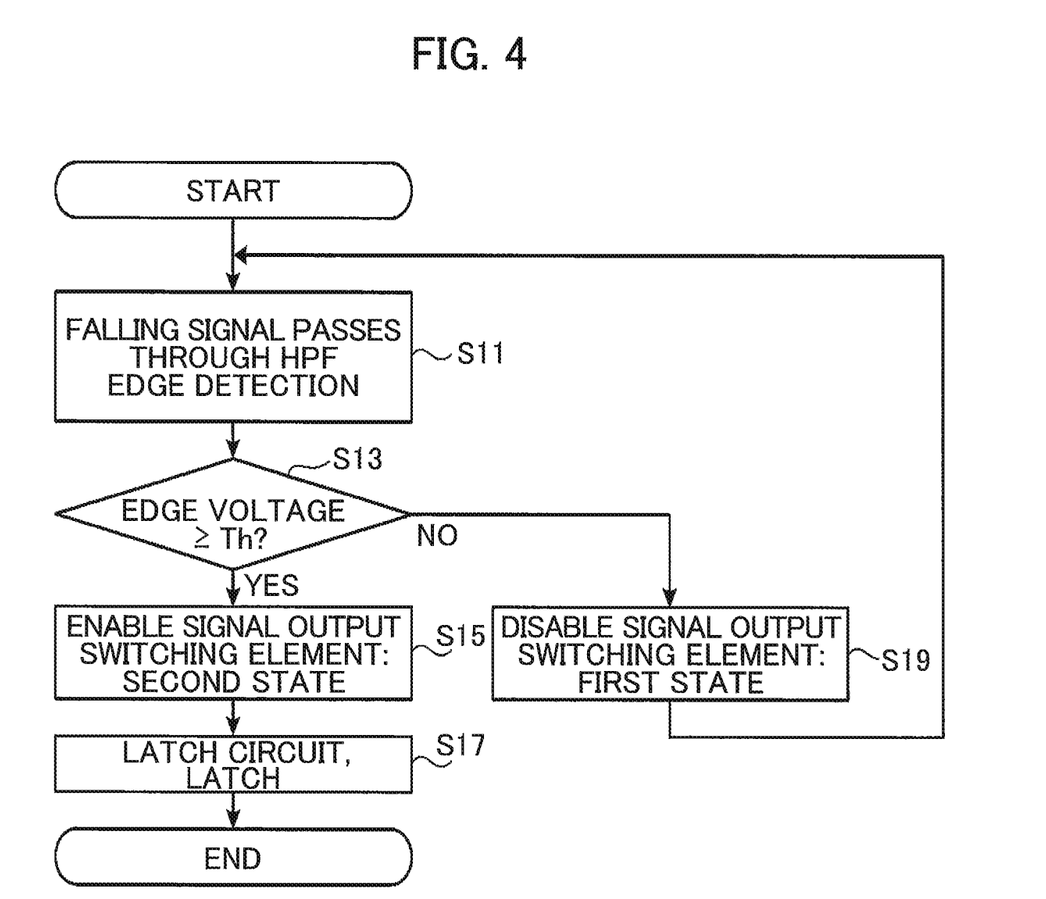
FIG. 4 is a flowchart illustrating operations of the power source circuit 30.
Figure 5:
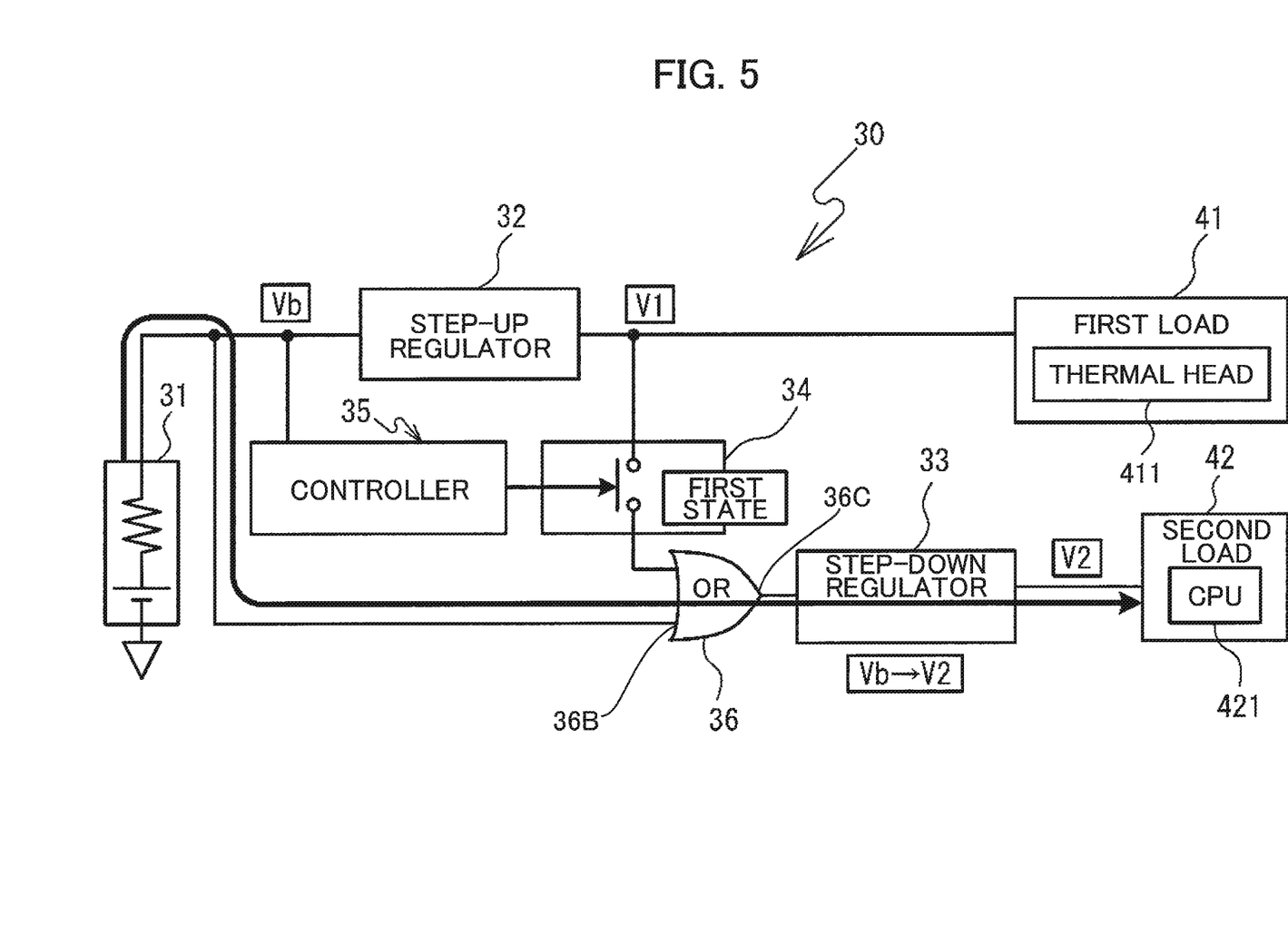
FIG. 5 is a diagram illustrating application of a second voltage V2 to a second load 42 when the switching element 34 is in a first state.

As illustrated in FIG. 4, in S17, the latch circuit 353 latches the output state of the controller 35 after the controller 35 outputs the enable signal from the output terminal 35B of the controller 35. Specifically, the latch circuit 353 latches the output state in which the enable signal is outputted from the output terminal 35B. In other words, the switching element 34 is maintained in the second state.

Figure 7:
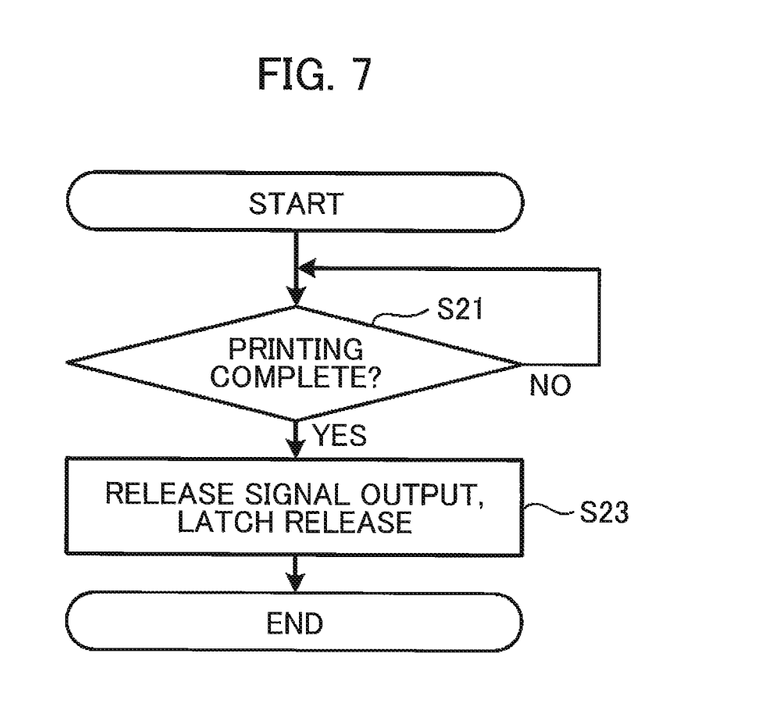
FIG. 7 is a flowchart illustrating processes executed by a CPU 42.

Next, a processing process of the CPU in the case where the printing process is completed will be described with reference to the flowchart of FIG. 7. After the start of the printing process, in S21 the CPU 421 determines whether the printing process is completed. When the CPU 421 determines that the printing process has not yet been completed (S21: NO), the CPU 421 performs S21 again. That is, the CPU 421 continuously monitors whether the printing process has been completed. On the other hand, when the CPU 421 determined that the printing process has been completed (S21: YES), the CPU 421 performs S23. In this case, as the heating by the thermal head 411 is stopped, the 1 current flowing in the first load 41 decreases, so that the possibility that the battery voltage Vb of the battery 31 rises increases. Therefore, in S23 the CPU 421 outputs the release signal to the control terminal 35C of the latch circuit 353 of the controller 35 so that the step-down regulator 33 generates the second voltage V2 from the battery voltage Vb. The CPU 421 ends the process all needed.

The latch circuit 353 releases the latch that maintains the state where the enable signal is output in response to the release signal being input to the control terminal 35C. The signal outputs from the output terminal 35B switches from the enable signal from the disable signal in response to the release of the latch by the latch circuit 353. The switching element 34 is switched from the from the second state to the first state as the disable signal is inputted to the switching element 34 via the control terminal 34C. In this case, since the terminals 34A and 34B of the switching element 34 are not conducted, a voltage input to the OR circuit 36 via the input terminal 36A of the OR circuit 36 is 0V. The OR circuit 36 outputs the battery voltage Vb inputted via the input terminal 36B from the output terminal 36C. The step-down regulator 33 lowers the battery voltage Vb to generate the second voltage V2 (see FIG. 5).

Main Effect of Present Embodiment

As described above, the step-up regulator 32 of the power source circuit 30 boosts the battery voltage Vb of the battery 31 to the first voltage V1. When the first voltage is not input to the step-down regulator 33, the step-down regulator 33 steps down the battery voltage Vb to the second voltage V2. On the other hand, when the first voltage V1 is inputted to the step-down regulator 33, the step-down regulator 33 steps down the first voltage V1 to the second voltage V2. The switching element 34 can switch between the first state and the second state. Specifically, the state of the switching element 34 can be switched between a state in which the first voltage V1 is not inputted to the step-down regulator 33 and a state in which the first voltage V1 is inputted to the step-down regulator 33. As illustrated in FIG. 4, in S15, the controller 35 switches the switching element 34 to the second state from the first state based on the variation or fluctuation of the battery voltage Vb due to the variation of the load current flowing in the first load 41.

Here, in the conventional power source circuit, when a battery voltage detected by a voltage detector is smaller than or equal to a predetermined value, a switch is switched so that a battery voltage becomes a first voltage. However, in the configuration of the conventional power source circuit, it is necessary to set the predetermined value to a higher value in consideration of a voltage drop caused by a variation of a load current.

In contrast, in the present embodiment, the power source circuit 30 detects the variation of the battery voltage Vb due to the variation of the load current flowing in the first load 41 by the HPF circuit 351 and the edge detection circuit 352. As illustrated in FIG. 4, in S15, when the edge detection circuit 352 detects an edge voltage being greater than or equal to the threshold value, the controller 35 switches the switching element 34 to the second state from the first state. Here, for example, when the battery voltage Vb instantaneously drops down, the steep falling signal which indicates the instantaneously dropping down of the battery voltage Vb includes a high frequency component. Therefore, the controller 35 can reliably detect the instantaneously dropping down of the load current by using the HPF circuit 351 and the edge detection circuit 352. And then, the controller 35 can determines a timing at which the switching element 34 is switched from the first state to the second state by comparing the edge voltage with the threshold value.

In this case, the timing in which the switching element 34 is switched can be delayed until the battery voltage becomes lower. That is, in the power source circuit 30 of this embodiment, the step-down regulator 33 lowers the battery voltage Vb to the second voltage V2 until the battery voltage Vb becomes lower than that of the battery mounted in the conventional printing device.

As a voltage difference between the input terminal 33A and the output terminal 33B of the step-down regulator 33 increases, a power loss when the step-down regulator 33 generates the second voltage V2 increases. That is, the power loss is greater in the case where the step-down regulator 33 generates the second voltage V2 from the first voltage V1 than in the case where the step-down regulator 33 generates the second voltage V2 from the battery voltage Vb. According to the present embodiment, the step-down regulator 33 continues to lower the battery voltage Vb to the second voltage V2 so that the power loss generated when the step-down regulator 33 lowers the first voltage V1 to the second voltage V2 can be suppressed.

In S11 controller 35 detects the edge voltage of the output voltage which is output in response to the battery voltage Vb being supplied to the HPF circuit 351 by using the edge detection circuit 352. Therefore, the power source circuit 30 detects the high frequency component of the variation of the battery voltage Vb due to the instantaneously dropping down of the load current so that the switching element 34 can be switched from the first state to the second state.

When the printing process is started, as the heating by the thermal head 411 is repeated carried out, the load current flowing in the first load 41 continuously increases, so that the battery voltage Vb of the battery 31 lowers. According to this embodiment, in S17 the latch circuit 353 of the controller 35 latches the output state of the controller 35 after the controller 35 outputs the enable signal from the output terminal 35B of the controller 35. Specifically, the latch circuit 353 latches the output state in which the enable signal is output from the output terminal 35B. In other words, the switching element 34 is maintained in the second state after the switching element 34 is switched from the first state to the second state. Therefore, the state in which the step-down regulator 33 generates the second voltage V2 from the first voltage V1 is maintained. Accordingly, the power source circuit 30 supplies the second voltage V2 stably by virtue of the step-down regulator 33, even if the thermal head 411 heats up at the start of the printing process and the battery voltage Vb continuously decreases due to the increasing of the load current.

When the printing process is completed, as the heating by the thermal head 411 is stopped, the load current flowing in the first load 41 decreases, so that the possibility that the battery voltage Vb of the battery 31 increases. Therefore, as illustrated in FIG. 7, in S23, the printing process is completed (S21: YES), the CPU 421 outputs the release signal to the control terminal 35C of the controller 35. At this time, the signal outputs from the output terminal 35B switches from the enable signal from the disable signal in response to the release of the latch by the latch circuit 353. In this case, Since the switching element 34 is switched from the second state to the first state, the step-down regulator 33 generates the second voltage V2 from the battery voltage Vb. According to the present embodiment, when the battery voltage Vb rises due to the end of printing, the step-down regulator 33 generates the second voltage Vb from the battery voltage Vb so that the power loss generated when the step-down regulator 33 lowers the first voltage V1 to the second voltage V2 can be suppressed.

Modifications

While the description has been made with reference to the embodiment, the configuration of the device and/or the content of the processing can be appropriately changed.

The power source circuit 30 may include a switch circuit in which the switching element 34 and the OR circuit 36 are integrated instead of the switching element 34 and the OR circuit 36. In this case, when the disable signal is inputted to the switch circuit, the switching circuit conducts between the battery 31 and the input terminal 33A of the step-up regulator 32 while the switching circuit does not conduct between the output terminal 32B of the step-up regulator 32 and the input terminal 33A of the step-down regulator 33. On the other hand, when the enable signal is inputted to the switching circuit, the switching circuit conducts between the output terminal 32B of the step-up regulator 32 and the input terminal 33A of the step-down regulator 33 while the switching circuit does not conduct between the battery 31 and the input terminal 33A of the step-down regulator 33.

The HPF circuit 351 is not limited to an analog filter circuit composed of a resistor and a capacitor. The HPF circuit 353 may be a filter circuit using an operational amplifier or a digital filter circuit. In the power source circuit 30, a capacitor functioning as AC coupling may be connected in series between the input terminal 35A and the edge detection circuit 352 instead of the HPF circuit. The edge detection circuit 352 is not limited to be configured by the relay, a capacitor and a diode. For example, the edge detection circuit 352 may detect an edge by analyzing a digital data obtained by sampling and converting the output voltage of the HPF circuit 351. The controller 35 may realize the function of the latch circuit 353 by the aid of the CPU 421. For example, the CPU 421 may be configured to switch the signal output from the output terminal 35B of the controller 35 between the enable signal and the disable signal based on a signal output from the edge detection circuit 352.

In the present embodiment, the power source circuit 30 is incorporated in the thermal printing device 1. However, an apparatus into which the power source circuit 30 is incorporated is not limited to the thermal printing device. The power source circuit 30 may be incorporated in a printing device driven by another printing method other than the thermal type. In this case, the printing device 1 may not include the thermal head 411. Incidentally, the power source circuit 30 is not limited to being incorporated in the printing device. The power source circuit 30 may be incorporated in various electronic devices other than the printing device.

When the CPU 421 determines that the printing process is completed (S21: YES), the CPU 421 may not output the release signal to the control terminal 35C of the latch circuit 353 of the controller 35, so that the latch circuit 353 may not release the latched condition by which the enable signal is output from the output terminal 35B. That is, when the switching element 34 of the power source circuit 30 is switched to the second state from the first state by the controller 35, the switching element 34 may be configured to be maintained in the second state until the battery is replaced with a new one.

OTHERS

The step-up regulator 32 is an example of a first converter. The step-down regulator 33 is an example of a second converter. The switching element 34 is an example of a switch. The CPU 421 is an example of a releasing part.

What is claimed is:
1. A power source circuit comprising:
   a first converter configured to convert a battery voltage of a battery to a first voltage higher in level than the battery voltage, the first voltage being supplied to a first load;
   a second converter configured to convert selective one of the battery voltage and the first voltage to a second voltage lower in level than the voltage to be converted, the second voltage being supplied to a second load;
   a switch configured to switch between a first state and a second state, in which in the first state, the first voltage is not supplied to the second converter whereas in the second state, the first voltage is supplied to the second converter; and
   a controller configured to detect change in a first current flowing in the first load, the first current being liable to change caused by an instantaneous change of the first load, the controller controlling the switch to change the first state to the second state in response to detection of the change in the first current,
   wherein the second converter is configured to convert the battery voltage to the second voltage lower than the battery voltage when the switch switches to the first state and convert the first voltage to the second voltage lower than the first voltage when the switch switches to the second state.

2. The power source circuit according to claim 1, wherein the controller comprises an AC coupling supplied with the battery voltage and outputting an output voltage; and
   an edge detecting circuit configured to detect an edge of the output voltage outputted from the AC coupling.

3. The power source circuit according to claim 2, wherein the AC coupling comprises a high-pass filter.

4. The power source circuit according to claim 2, wherein the controller comprises a latch circuit configured to latch the second state when the first state is switched to the second state by the switch.

5. A thermal printing device comprising:
   the power source circuit according to claim 1; and
   a thermal head driven by the first voltage supplied from the power source circuit.

6. A thermal printing device comprising:
   the power source circuit according to claim 4;
   a thermal head driven by the first voltage supplied from the power source circuit; and
   a releasing portion configured to release the latched state and operate the switch so that the second state is switched to the first state from the second state after printing with the thermal head is finished.

7. The power source circuit according to claim 1 further comprising the battery having two terminals across which the battery voltage is developed.

8. A power source circuit comprising:
   a first converter configured to convert a battery voltage developed across a battery to a first voltage greater than the battery voltage, the first voltage being supplied to a first load;
   a second converter configured to convert selective one of the battery voltage and the first voltage to a second voltage lower than the voltage to be converted, the second voltage being supplied to a second load;
   a switch configured to switch between a first state and a second state, in which in the first state, the first voltage is not supplied to the second converter whereas in the second state, the first voltage is supplied to the second converter; and
   a controller configured to perform:
      (a) applying the first voltage to the first load to drive the first load;
      (b) detecting an edge voltage indicating an instantaneous voltage drop of the battery voltage;
      (c) determining whether the edge voltage is equal to or greater than a threshold value;
      (d) outputting an enable signal to the switch to switch to the second state from the first state in response to the (c) determining determining that the edge voltage is equal to or greater than the threshold value; and
      (e) latching the second state attained in the (d) outputting.

9. The power source circuit according to claim 8, wherein the controller is configured to further perform:
   (f) outputting a disable signal to the switch to switch to the first state from the second state in response to the (c) determining determining that the edge voltage is smaller than the threshold value, whereat the (e) latching releases latching the second state; and
   (g) subsequently performing the (a) applying, the (b) detecting, and the (c) determining.

10. A thermal printing device comprising:
the power source circuit according to claim 8; and
a thermal head driven by the first voltage supplied from the power source circuit.

11. A thermal printing device comprising:
the power source circuit according to claim 9; and
a thermal head driven by the first voltage supplied from the power source circuit.

12. The power source circuit according to claim 8 further comprising the battery having two terminals across which the battery voltage is developed.

\* \* \* \* \*